US006991703B2

(12) United States Patent
Ootsuka et al.

(10) Patent No.: US 6,991,703 B2
(45) Date of Patent: Jan. 31, 2006

(54) BONDING METHOD, BONDING STAGE AND ELECTRONIC COMPONENT PACKAGING APPARATUS

(75) Inventors: Takeshi Ootsuka, Tokyo (JP); Mamoru Kosakai, Tokyo (JP)

(73) Assignee: Sumitomo Osaka Cement Co., Ltd., (JP)

( * ) Notice: Subject to any disclaimer, the term of this patent is extended or adjusted under 35 U.S.C. 154(b) by 0 days.

(21) Appl. No.: 10/668,483

(22) Filed: Sep. 22, 2003

(65) Prior Publication Data
US 2004/0063251 A1 Apr. 1, 2004

(30) Foreign Application Priority Data
Sep. 26, 2002 (JP) ............................ P2002-281071

(51) Int. Cl.
H01L 21/60 (2006.01)

(52) U.S. Cl. ............................... 156/379.6; 156/379.8; 156/381; 29/740

(58) Field of Classification Search ............. 156/272.6, 156/379.6, 379.8, 380.4, 381; 118/723 R; 427/533, 534, 535, 569; 29/739, 740
See application file for complete search history.

(56) References Cited

U.S. PATENT DOCUMENTS

2001/0050143 A1 * 12/2001 Crocker ...................... 156/345
2003/0150563 A1 * 8/2003 Kuibara et al. ......... 156/345.51
2003/0178474 A1 * 9/2003 Jiang et al. ................. 228/205

FOREIGN PATENT DOCUMENTS

| JP | 62-296433 | 12/1987 |
| JP | 64-061923 | 3/1989 |
| JP | 11340614 | 10/1999 |
| JP | 2000-138255 | 5/2000 |
| JP | 2001 308114 | 2/2001 |
| JP | 2002-297880 | 10/2003 |
| JP | 2003-318217 | 11/2003 |

OTHER PUBLICATIONS

English translation of Abstract for Japanese Patent application No. 64-061923.
English translation of Abstract for Japanese Patent application No. JP 11340614.
English translation of Abstract for Japanese Patent application No. JP 2001 308114.
Office Action issued by Japanese Patent Office on Jan. 11, 2005 in connection with corresponding Japasene application No. 2002-281071.
English translation of Japanese Office Action dated Jan. 11, 2005.

* cited by examiner

Primary Examiner—John T. Haran
(74) Attorney, Agent, or Firm—Ostrolenk, Faber, Gerb & Soffen, LLP

(57) ABSTRACT

A bonding method is provided in which an electronic component is connected via bumps to a substrate and the electronic component is packaged on the substrate. A surface of the substrate that packages the electronic component, a surface of the electronic component that is connected to the substrate, and a surface of the bumps undergo plasma processing. Subsequently, the bumps are heated to a temperature lower than a melting point of the bumps, and the substrate and the electronic component are compression bonded via the bumps.

10 Claims, 4 Drawing Sheets

BONDING METHOD, BONDING STAGE AND ELECTRONIC COMPONENT PACKAGING APPARATUS

BACKGROUND OF THE INVENTION

1. Field of the Invention

The present invention relates to a bonding method, a bonding stage, and an electronic component packaging apparatus that includes this bonding stage. In particular, the present invention relates to a bonding method, a bonding stage, and an electronic component packaging apparatus that packages electronic components such as a semiconductor chip on a substrate in a plasma atmosphere.

Priority is claimed to Japanese application No. 2002-281071, filed Sep. 26, 2002, which is incorporated herein by reference.

2. Description of Related Art

As is shown, for example, in Japanese Patent Application Laid-Open (JP-A) No. 64-61923, the apparatus shown in FIG. 4 is known as a semiconductor chip packaging apparatus that includes a conventional bonding stage.

In FIG. 4, the descriptor 100 is a semiconductor chip packaging apparatus. This semiconductor chip packaging apparatus 100 is supported by a supporting column 132 standing on a base 130 such that an ultrasonic oscillator 134 is able to be raised and lowered freely in the directions indicated by the arrows in FIG. 4. A semiconductor chip adhesion device 136 is mounted on a distal end of the ultrasonic oscillator 134, and a semiconductor chip 180 is able to be adhered to and held by a bottom end of the semiconductor chip adhesion device 136.

A table 138 used for position adjustment is provided on a top surface of the base 130, and a heater 140 is provided on a top surface of the position adjustment table 138. As is shown in FIG. 5A, a circuit substrate 141 is placed and held on a top surface of the heater 140. A predetermined circuit pattern 120 is formed on the circuit substrate 141, and bumps 116 are formed connecting to the circuit pattern 120.

In order to perform packaging by bonding using this type of semiconductor chip packaging apparatus 100, firstly, the relative positions of the semiconductor chip 180 and the circuit substrate 141 are adjusted by the position adjustment table 138.

Next, the bumps 116 are heated by the heater 140 to a temperature at which they will melt. At the same time, as is shown in FIGS. 5B and 5C, the ultrasonic oscillator 134 is lowered and ultrasonic oscillation is applied so that thermocompression bonding is achieved at a predetermined pressure. A cooling process is then performed. As a result, the semiconductor chip 180 and the circuit substrate 141 that packages the semiconductor chip 180 are bonded via the bumps 116.

As is described, for example, in JP-A No. 11-340614, a known method for connecting electronic components such as semiconductor devices to circuit substrates is a bonding method that includes a step in which oxide film formed on the surfaces of the bumps is removed, a step in which the bumps are left in a predetermined environment for a predetermined time so that a reoxide film is formed on the bump surfaces, and a step in which the bumps are heated, melted and then allowed to harden so that bonding is achieved. In this method, a method of removing the oxide film using sputtering based on plasma processing is disclosed.

Furthermore, as is disclosed, for example, in JP-A No. 2001-308144, a flip chip packaging method is known in which the surfaces of lead-free, tin-zinc based bumps are improved by an irradiation of hydrogen-containing plasma. A fluorine-containing layer is then formed on the bump surfaces using fluorine-containing plasma so as to prevent reoxidation of the bumps, and the bumps are then heated and melted, resulting in bonding being achieved.

However, in the above described semiconductor chip packaging apparatus 100 and in the electronic component bonding method, because it is necessary to heat the bumps to a temperature at which they will melt, for example, approximately 250 to 550° C., and to then rapidly cool them, the problems exist that throughput of the packaging of electronic components such as semiconductor chips is poor, and the bonding efficiency is unsatisfactory.

Moreover, in the semiconductor chip packaging apparatus 100, the temperature distribution of the heater 140 may not necessarily be uniform, so that unmelted bumps also exist. Accordingly, the problem occurs of it not being possible to perform packaging that provides a high yield and high reliability, and this also generates unsatisfactory bonding efficiency.

The present invention was conceived in order to solve the above described problems in the conventional technology, and it is an object thereof to provide a bonding method, bonding stage, and electronic component packaging apparatus that make possible packaging that provides; a high yield and high reliability at a lower temperature that does not require bumps to be heated to melting temperature, and to thereby improve the throughput of electronic component packaging, and improve bonding efficiency.

SUMMARY OF THE INVENTION

The inventors of the present invention investigated ways of solving the above described problems. As a result, they discovered that the bumps, the substrate and the electronic component were cleaned bit being exposed to plasma. They also discovered that if, subsequently, compression bonding was carried out, the electronic component could be easily bonded onto the substrate, and thus they attained the present invention.

The first aspect of the present invention is a bonding method in which an electronic component is connected via bumps to a substrate and the electronic component is then packaged on the substrate, having the steps of performing plasma processing on a surface of the substrate that packages the electronic component, a surface of the electronic component that is connected to the substrate, and a surface of the bumps, heating the bumps to a temperature lower than a melting point of the bumps, and compression bonding the substrate and the electronic component via the bumps.

In this bonding method by exposing the bumps to plasma and by also exposing the circuit substrate and the electronic component to plasma, these components are cleaned. Therefore, it is possible to perform packaging at a low temperate that is lower than the melting point of the bumps, meaning that the bumps do not have to be heated to a high temperature above the melting point thereof. Accordingly, the packaging throughput of electrical components such as semiconductor chips is improved, and the bonding efficiency can also be improved. As a result, it is possible to achieve packaging that provides a high yield and a high level of reliability.

It is also preferable that ultrasonic waves be directed on the bumps when the substrate and the electronic component are being compression bonded via the bumps.

If this method is employed, any oxide layer on the bump surfaces is removed by the action of the ultrasonic waves.

By exposing non-oxidized surfaces of the bumps, the compression bonding can be more reliably and more satisfactorily performed. Accordingly, it is possible to achieve packaging that provides a high yield and a high level of reliability.

The second aspect of the present invention is a bonding stage that packages an electronic component on a substrate, having a placement member, the placement member having a plasma generating electrode and an electrostatic adhesion electrode, and the placement member having a placement surface on which is placed the substrate or the electronic component.

Because in this bonding stage there is an electrode for electrostatic adhesion, it is possible to electrostatically adhere a substrate or electronic component that has been placed on the placement surface of the placement member. Furthermore, because there is an electrode for generating plasma, plasma processing can be performed on a substrate and electronic component on the placement surface as well as on bumps located between the substrate and electronic component. Therefore, this is extremely suitable for implementing the aforementioned bonding method.

Accordingly, it is possible to perform packaging at a low temperature that is lower than the melting point of he bumps, meaning that the bumps do not have to be heated to a high temperature above the melting point thereof. Accordingly, the packaging throughput of electrical components such as semiconductor chips is improved, and the bonding efficiency can also be improved. As a result, it is possible to achieve packaging that provides a high yield and a high level of reliability.

Note that in the present invention an embodiment may be employed in which the same electrode functions as both the plasma generating electrode and the electrostatic adhesion electrode.

The placement member may also be provided with a heater electrode.

If this structure is employed, it is possible to heat a substrate and an electronic component on the placement surface as well as on bumps located between the substrate and electronic component to a desired temperature.

It is also preferable that there be provided a cylindrical supporting member that supports the placement member, and that one aperture portion of the supporting member be joined in an airtight seal to the placement member, and that a ceramic thermal insulation material be provided inside the supporting member.

If this structure is employed, because the ceramic thermal insulation material is provided inside the supporting member, the placement member has sufficient resistance even if compression bonding pressure (i.e., bonding pressure) is applied repeatedly to the placement member by the bonding. As a result, damage to the placement base and supporting member is prevented and, furthermore, the placement surface has excellent heat equalizing properties.

Note that it is preferable that the ceramic thermal insulation material be an $Al_2O_3$—$SiO_2$—$CaO$—$Li_2O$ based ceramic thermal insulation material.

If this material is employed, because the $Al_2O_3$—$SiO_2$—$CuO$—$Li_2O$ based ceramic thermal insulation material has excellent compression resistance and thermal insulation properties, as described above, the placement member has a more satisfactory resistance to repeatedly applied compression bonding pressure (i.e., bonding pressure). Moreover, the placement surface is thereby provided with even better heat equalizing properties.

It is also preferable that the supporting member be formed from stainless steel or an Fe—Ni—Co based alloy.

If this structure is employed, because Fe—Ni—Co base alloys have excellent heat resistance, plasma resistance, mechanical strength and the like, the durability of the bonding stage itself is improved.

It is also preferable that the placement member be joined to the supporting member via an O-ring or a metal gasket.

Because it is possible using the above described bonding stage to perform a packaging process with the bumps at a low temperature that is lower than the melting point of the bumps, the placement member can be joined to the supporting member using a common O-ring or metal gasket without having to rely on a bonding method that has excellent heat resistance. Accordingly, the joining of the two can be achieved at a lower cost and more easily than when a bonding method that has excellent heat resistance is used.

The third aspect of the present invention is an electronic component packaging apparatus having the above described bonding stage, a bonding tool positioned above the bonding stage, and a chamber that houses the bonding stage and the bonding tool.

In this electronic component packaging apparatus, because the bonding stage can perform packaging at a low temperature that is lower than the melting point of the bumps, thereby making it possible to perform packaging that provides a high yield and a high level of reliability, the packaging throughput of electrical components is improved, and the bonding efficiency can also be improved.

It is also preferable that the bonding tool be provided with an electrostatic adhesion mechanism that electrostatically holds the substrate or the electronic component.

If this structure is employed, the substrate and electronic component can be held and fixed in position on the placement member even more stably by the electrostatic adhesion mechanism.

It is also preferable that the bonding tool be provided with at least a plasma generating electrode and a heater electrode.

If this structure is employed, it is possible, particularly when a plasma generating electrode is provided, to generate plasma even more stably. Moreover, it is possible, particularly when a heater electrode is provided, to heat the bumps efficiently to a predetermined temperature in a short period of time.

It is also preferable that there be provided a pressure application mechanism that applies pressure to the bonding tool.

If this structure is employed, it is possible to apply a predetermined pressure to the bonding tool using the pressure application mechanism. Accordingly, the substrate and the electrical component can be reliably bonded, making it possible to perform packaging that provides a high yield and a high level of reliability.

It is also preferable that the bonding tool be provided with an ultrasonic device that emits ultrasonic waves.

If this structure is employed, any oxide layer on the surface of the bumps is removed by the action of the ultrasonic waves. By exposing non-oxidized surfaces of the bumps, the compression boarding can be more reliably and more satisfactorily performed. Accordingly, it is possible to improve the bonding efficiency.

DETAILED DESCRIPTION OF THE INVENTION

Figure 1:
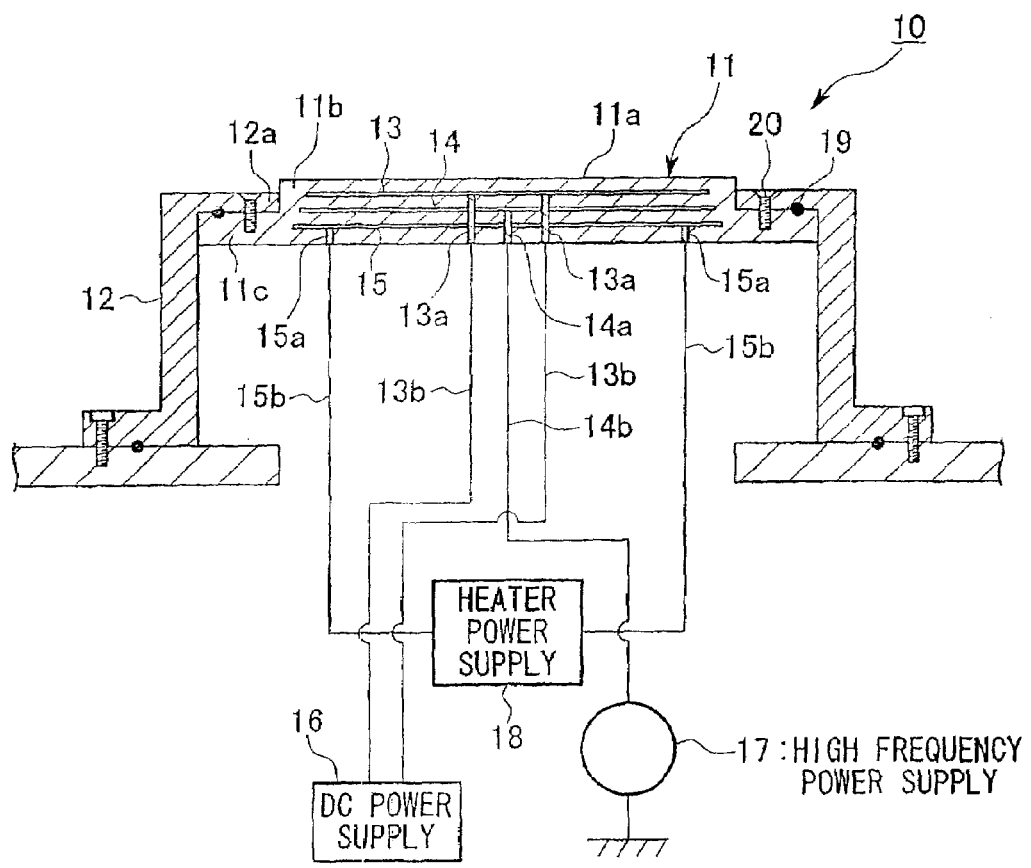
FIG. 1 is a side cross-sectional view showing the schematic structure of the first embodiment of the bonding stage of the present invention.

Embodiments of the present invention will now be described in detail.

These embodiments are intended to more fully explain the present invention, and a semiconductor chip is used as a example of an electronic component. In addition, a circuit substrate on which a predetermined circuit pattern has been formed and which is used to package a semiconductor chip is used as an example of a substrate. The method used to bond these together is flip chip bonding.

(Flip Chip Bonding)

Firstly, the bonding method of the present invention will be described.

In this example, as is stated above, the bonding method of the present invention is applied to flip chip bonding. In this method, an electronic component (i.e., a semiconductor chip) is connected via bumps to a substrate (i.e., a circuit substrate), and the electronic component is packaged on the substrate. Furthermore, in this method, plasma processing is performed on the surface of the substrate on the side on which the electronic component is packaged, on the surface of the electronic component on the side that is connected to the substrate, and on the surfaces of the bumps. Next, the bumps are heated to a temperature lower than their melting temperature and the substrate and electronic component are bonded via the bumps.

Although the bonding mechanism in this method may not be understood, it is believed to be due to the mechanism described below.

If the bump material is exposed to plasma, oxide film on the surface thereof is removed and the bump material is softened. Moreover, if a pad metal formed by Al or Au or the like on the semiconductor chip or circuit substrate is exposed to plasma, the surface thereof is cleaned. It the surface oxide layer between the pad metal on the semiconductor chip and the paid metal on the circuit substrate that have been cleaned in this manner is then removed and a fresh surface is exposed, so that softened bumps are prepared and then bonded, the pad metal on the semiconductor chip and the pad metal on the circuit substrate are easily connected via the bumps, and the semiconductor chip and the circuit substrate are easily bonded.

Furthermore, the bumps are not particularly restricted and, for example, Au—Sn alloys, Pb—Sn alloys, Sn—Zin alloys. Sn—Ag—Cu alloys, Sn—Cu alloys, and the like may be used as the material therefor.

Furthermore, the temperature during the bonding process is not necessarily restricted and may, of course, be appropriately set in accordance with the melting point of the bumps that are used. The bonding temperature may be set at 150° C. or more, and preferably at 200° C. or more, but, in particular, is set at less than the temperature at which the bumps melt (i.e., the melting point). The reason for this is that, as is described above, because the bumps are cleaned by being exposed to plasma, and the pad metal of the substrate and electronic component is also cleaned by being exposed to plasma, it is possible to perform the packaging process by bonding the bumps at a temperature lower than the melting point thereof without heating the bumps to a temperature higher than the melting point thereof. Note that specific sub-melting point temperatures vary depending on the type of bumps that are used.

The plasma used in the surface processing of the bumps and the pad metal of the substrate and electronic component is not particularly restricted and, for example, Ar plasma, Kr plasma, and the like, which are inert plasmas, may be favorably used. An output of several W to several hundred W is sufficient for the plasma output, and the time of the exposure to the plasma may be extremely short with, for example, 30 seconds to 1 minute being sufficient.

It is preferable that ultrasonic waves be used when bonding is being performed. The reason for this is that if ultrasonic waves are used, the oxide layer on the bumps can be easily removed and a new surface easily exposed. There is no particular restriction on the type of ultrasonic waves that can be used; however, it is preferable that ultrasonic waves having an ultrasonic wave output of 5W and an output amplitude of approximately 1 to 30 micro-inches be used as approximately 100% of the yield can have excellent connections.

In this type of flip chill bonding method, because the bumps are exposed to plasma, and because the substrate and electronic component are cleaned as a result of their being exposed to plasma, it is possible to package the substrate and electronic component at a temperature lower than the melting point of the bumps without the bumps having to be heated to a high temperature in excess of the melting point thereof. Accordingly, the throughput of the packaging of electronic components such as semiconductor chips can be improved and the bonding efficiency also improved. As a result, a high yield and highly reliable packaging can be achieved.

(The Bonding Stage)

Next, the bonding stage of the present invention will be described.

(First Embodiment)

FIG. 1 is a view showing a first embodiment of a bonding stage that may be favorably used to implement the above described flip chip bonding method. In FIG. 1, the reference numeral 10 is a bonding stage. The bonding stage 10 is provided with a placement base 11 (i.e., a placement member) that has a placement surface 11a on which is placed either a circuit substrate (i.e., a processed substrate (not shown)) on which a predetermined circuit pattern has been formed or a semiconductor chip (i.e., an electronic component (not shown)). The bonding stage 10 is also provided with a supporting member 12 having a cylindrical configuration that supports the placement base 11.

The placement base 11 is substantially disk shaped and has a top disk portion 11b on an upper surface thereof, and a bottom disk portion 11c having a larger diameter than the top disk portion 11b on the bottom surface thereof. The placement base 11 is made from ceramic that has excellent plasma resistance. The ceramic that may be favorably used here may be selected from aluminum nitride, aluminum oxide, silicon nitride, silicon oxide, zirconium oxide, titanium oxide, sialon, boron nitride, and silicon carbide, or may be a compound that includes two or more of these ceramics. The thickness of the placement base 11 need only be sufficient to withstand the pressure applied during bonding and may be set, for example, to between 5 mm and 15 mm.

Electrodes 13, 14, and 15 are embedded inside the placement base 11. The electrode 13 is an electrostatic adhesion electrode that electrostatically adheres the circuit substrate to the placement surface 11a when DC voltage is applied thereto. The electrode 14 is a plasma generating electrode that generates plasma when a high frequency voltage is applied thereto. The electrode 15 is a heater electrode that generates heat when power for electric heating is supplied thereto. The materials preferably used for the electrodes 13, 14, and 15 may be high melting point metals such as tungsten and molybdenum or conductive ceramics such as silicon carbide, titanium nitride, graphite, aluminum nitride-tungsten composite ceramics, aluminum nitride-tantalum nitride composite ceramics, aluminum oxide-tungsten composite ceramics, and aluminum oxide-tantalum carbide composite ceramics. Electrode materials whose coefficient of thermal expansion is as close a value as possible to the coefficient of thermal expansion of the placement base 11 are preferable. Note that the configuration, thickness, and the like of the electrodes 13, 14, and 15 may be appropriately altered, and it is sufficient if they correspond to the placement base with a built-in electrode that is used in a conventional plasma processing.

Wiring 13b is connected via power supply terminals 13a to the electrode 13. By connecting the wiring 13b to the DC power supply 16, electrostatic voltage is applied to the electrode 13. Moreover, wiring 14b is connected via a power supply terminal 14a to the electrode 14, By connecting the wiring 14b to the high frequency power supply 17, high frequency voltage is applied to the electrode 14. Furthermore, wiring 15b is connected via a power supply terminal 15a to the electrode 15. By connecting the wiring 15b to a heater power supply 18, power for electrical heating is applied to the electrode 15.

There are no particular restrictions on the material used for the power supply terminals 13a, 14a, and 15a provided that the material is conductive; however, it is preferable that the coefficient o:f thermal expansion of the material used be a value close to that of the coefficient of thermal expansion of the placement base 11. In particular, various types of conductive ceramics may be preferably used including, for example, aluminum nitride-tungsten composite ceramics, aluminum nitride-tantalum nitride composite ceramics, aluminum oxide-tungsten composite ceramics, and aluminum oxide-tantalum carbide composite ceramics.

An annular inner peripheral portion 12a is formed extending inwards on a top side of the supporting member 12. The top disk portion 11b of the placement base 11 engages with the inside of the aperture portion of the inner peripheral portion 12a. A top surface of the bottom disk portion 11c of the placement base 11 is placed against a bottom surface of the inner peripheral portion 12a, and an outer peripheral surface of the bottom disk portion 11c is placed against an inner peripheral surface of the supporting member 12. An O-ring 19 is provided between the inner peripheral portion 12a of the supporting member 12 and the top surface of the bottom disk portion 11c of the placement base 11. Moreover on the inner side of the O-ring 19, the inner peripheral portion 12a and the bottom disk portion 11c are mechanically joined by countersunk screws 20. As a result, the air tightness of the supporting member 12 and the placement base 11 in the portion where they are joined together is secured.

Here, in order to make the join between the supporting member 12 and the placement base 11 airtight, it is also possible to employ a bonding method that makes use of a type of heat resistant bonding agent. However, in the flip chip bonding method of the present invention in which i bonding stage is employed, because it is not necessary to heat the bumps to a temperature at which they melt, the O-ring 19 or, instead of this, a metal gasket (not shown) can be used as the joining device for ensuring air tightness. If a joining method that uses a metal gasket or an O-ring 19 such as this is employed, the heat processing at a high temperature that is required when a bonding method that uses a bonding agent is employed is not necessary. As a result, it is easy to manufacture the bonding stage 10. A ring made from a fluorine based resin such as polytetrafluoroethylene, for example, "Chemlats" (Registered Trademark) made by Greentweed and Company Ltd. may be favorably used as the O-ring 19. A common aluminum gasket or the like may be favorably used as the metal gasket.

In the present embodiments, a space is formed in the interior of the supporting member 12. This allows the wiring 13b, 14b, and 15b connected to the respective electrodes 13, 14, and 15 to communicate with the outside through the interior space and bottom aperture of the supporting member 12. Because this structure is employed, the respective wiring 13b, 14b, and 15b is cooled by the outside air.

The material used to form the supporting member 12 is not particularly restricted provided that it has excellent plasma resistance. Examples thereof that may be favorably used include copper, aluminum, titanium, stainless steel, and Fe—Ni—Co based alloys (for example, "Kovar" (Registered Trademark) alloy), as well as composite materials of ceramics and metals such as aluminum (for example, aluminum-silicon carbide composite ceramics that contain 20 to 70 percent by weight of silicon carbide). Among these materials, stainless steel and Fe—Ni—Co based alloys have the appropriate softness and, as described above, due to this, are suitable for the airtight join between the placement base 11 and the supporting member 12 via the O-ring 19 or the metal gasket. In addition, they have excellent heat resistance and mechanical strength, and also, compared with the other metal materials, these have excellent plasma resistance making them especially suitable for use.

It is preferable that at least the surfaces of the supporting member 12 that are exposed to plasma, namely, the top surface of the inner peripheral portion 12a and the outer peripheral surface of the supporting member 12 and the like undergo a plasma resistance processing if this is necessary. Examples of this plasma resistance processing include methods in which a ceramic spray deposit, such as aluminum oxide, zirconium oxide, and the like is formed.

In the bonding stage 10 of the present embodiment a bottom end portion of the supporting member 12 is fixed and held in an airtight seal to the bottom surface of a chamber (not shown) so as to be positioned inside this chamber.

By using the bonding stage 10 having the above described structure as a component in the semiconductor chip packaging apparatus (i.e., the electronic component packaging apparatus) described below, an excellent apparatus for implementing the above described flip chip bonding method is obtained.

(Second Embodiment)

Figure 2:
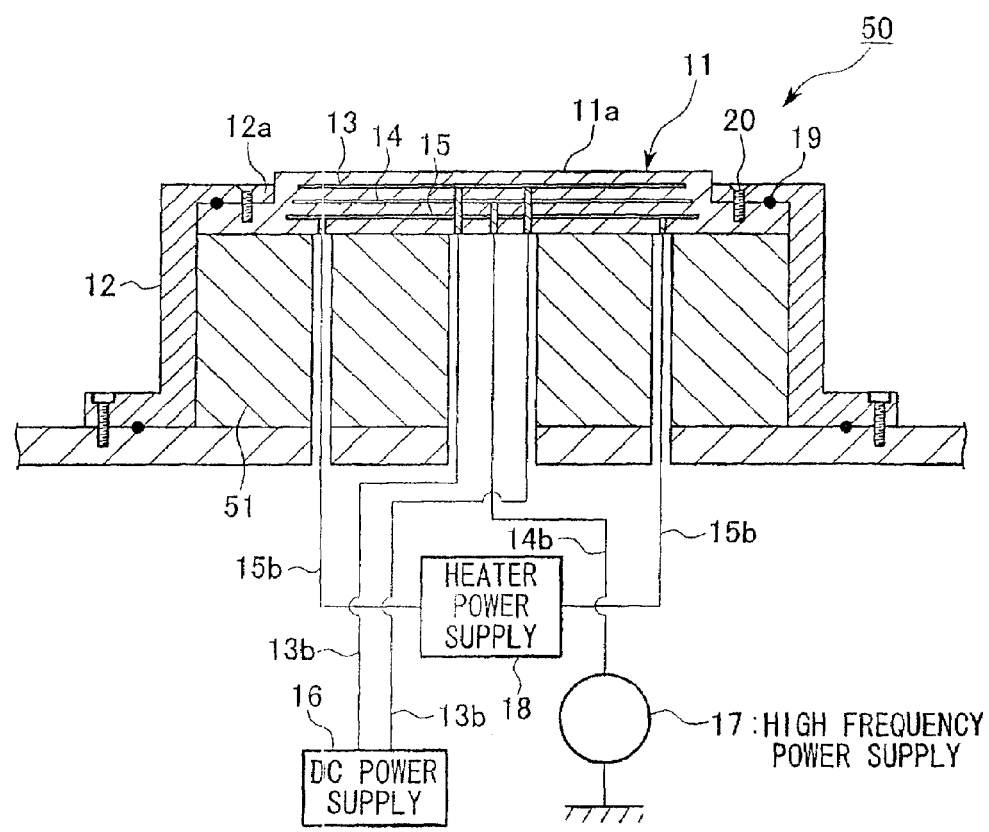
FIG. 2 is a side cross-sectional view showing the schematic structure of the second embodiment of the bonding stage of the present invention.

FIG. 2 is a view showing a second embodiment of a bonding stage that is excellent for implementing the above described flip chip bonding method. In FIG. 2, the descriptor 50 is a bonding stage. The bonding stage 50 differs from the bonding stage 10 shown in FIG. 1 in that a ceramic thermal insulation material 51 is placed in the internal space in the supporting member 12 so as to substantially fill this internal space. Through holes (not shown) that enable the respective wiring 13b, 14b, and 15b connected to the electrodes 13, 14, and 15 to pass through and be guided to the outside are formed in the ceramic thermal insulation material 51.

The material used for the ceramic thermal insulation material 51 is not particularly restricted; however it is preferable that it be an $Al_2O_3$—$SiO_2$—$CaO$—$Li_2O$ based ceramic thermal insulation material. If this type of thermal insulation material is employed, because the ceramic has excellent resistance to compression and thermal insulation, the bonding stage 50 has satisfactory resistance to compression bonding pressure (i.e., to bonding pressure). Moreover, the heat equalizing properties of the placement surface 11a are greatly improved. Moreover, because the coefficient of thermal expansion of this $Al_2O_3$—$SiO_2$—$CaO$—$Li_2O$ based ceramic thermal insulation material is a value close to that of the coefficient of thermal expansion of the material (i.e., stainless steel or "Kovar" (Registered Trademark) alloy) forming the supporting member 12, no unnecessary space is formed between the supporting member 12 and the ceramic thermal insulation material 51 even when heat is applied, which is also a favorable characteristic.

In a bonding stage 50 such as is described above, because the ceramic thermal insulation material 51 is placed inside the space so as to substantially fill the space, the bonding stage 50 has sufficient resistance even if compression bonding pressure (i.e., bonding pressure) is applied repeatedly to the placement surface 11a of the placement base 11. As a result, damage to the placement base 11 and supporting member 12 is prevented and, furthermore, the placement surface 11a has excellent heat equalizing properties.

(Semiconductor Chip Packaging Apparatus)

Figure 3:
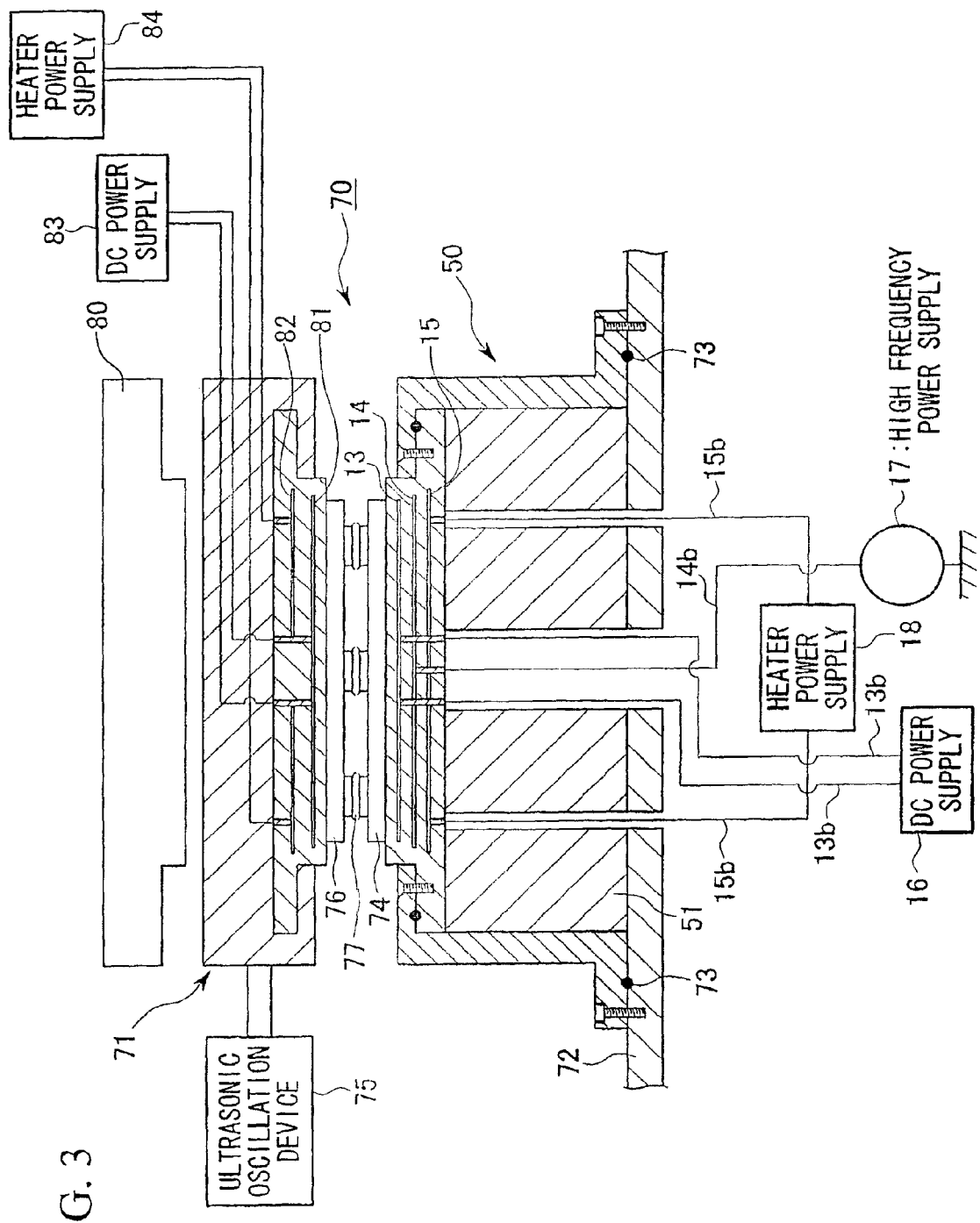
FIG. 3 is a schematic structural view, of an embodiment of the electronic component packaging apparatus of the present invention.
Figure 4:
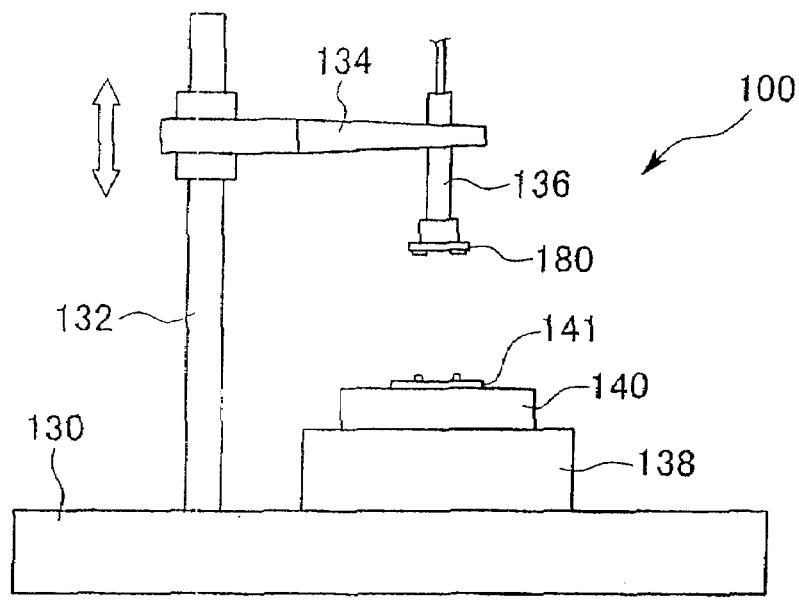
FIG. 4 is a schematic structural view of an example of a semiconductor chip packaging apparatus provided with a conventional bonding stage.
Figure 5A:
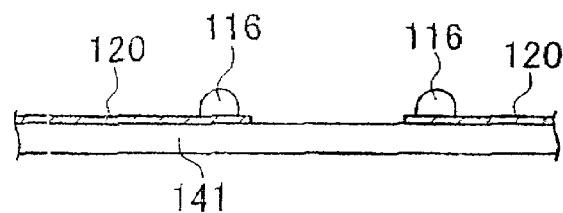
FIGS. 5A to 5C are enlarged views of principal portions describing the sequence of steps of a bonding method of the semiconductor chip packaging apparatus shown in FIG. 4.
Figure 5B:
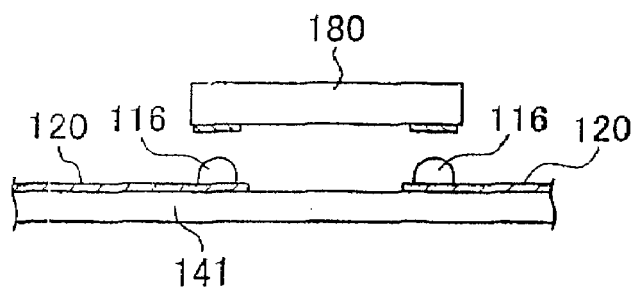
Figure 5C:
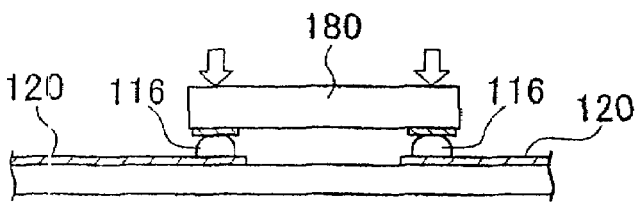

FIG. 3 is a view showing an embodiment of a semiconductor chip packaging apparatus (i.e., electronic component packaging apparatus) that is excellent for implementing the above described flip chip bonding method. This apparatus is constructed having the bonding stage 50 shown in FIG. 2.

In FIG. 3, the reference numeral 70 is a semiconductor chip packaging apparatus. The semiconductor chip packaging apparatus 70 is provided with the bonding stage 50, a bonding tool 71 positioned above the bonding stage 50, a chamber 72 that houses the bonding stage 50 and the bonding tool 71, and a pressure application device 80 positioned above the bonding tool 71.

Apertures (not shown) that allow the wiring 13b, 14b, and 15b connected to the respective electrodes 13, 14, and 15 to communicate with the outside are formed in a bottom portion of the chamber 72 that is positioned directly beneath the bonding stage 50. Moreover, the supporting member 12 of the bonding stage 50 is mechanically fixed by fastening devices such as bolts to the bottom surface of the chamber 72 that houses the bonding stage 50. An O-ring 73 is also provided between the supporting member 12 and the bottom surface of the chamber 72. By using this structure an airtight seal is secured between the supporting member 12 and the bottom surface of the chamber 72. As a result, the interior of the chamber 72 is prevented from communicating with the outside via the lead out apertures for the wiring 13b, 14b, and 15b.

Inside the bonding tool 71 are provided a heater electrode 82 and an electrostatic adhesion electrode (i.e., an electrostatic adhesion mechanism) 81 that generates an electrostatic adhesive force that electrostatically adheres and thereby fixes in place a circuit substrate 74. The electrostatic adhesion electrode 81 is connected by wiring or the like (not shown) to a DC power supply 83. The heater electrode 82 is connected by wiring or the like (not shown) to a heater power supply 84. Note that it is also possible to provide a plasma generating electrode in addition to the electrodes 81 and 82 or instead of the heater electrode 82. An ultrasonic oscillation device 75 that imparts ultrasonic oscillation to the bonding tool 71 is also provided in the bonding tool 71.

The pressure application device 80 is able to be raised and lowered in a vertical direction and is also able to be rotated in a horizontal direction. The pressure application device 80 is also constructed so as to be able to press the bonding tool 71 downwards with a predetermined pressure.

In order to bond (by flip chip bonding) a semiconductor chip 76 onto the circuit substrate 74 using the semiconductor chip packaging device 70 having the structure described above, firstly, the circuit substrate 74 is placed at a predetermined position on the placement surface 11a of the bonding stage 50. Next, electricity is supplied to the electrode 13 so that the circuit substrate 74 is made to electrostatically adhere to the placement surface 11a. Separately to this, the semiconductor chip 76 is made to electrostatically adhere at a predetermined position to the bottom surface of the bonding tool 71.

Next, the semiconductor chip 76 which is being held electrostatically by the bonding tool 71 is positioned relative to the circuit substrate 74 on the bonding stage 50. Note that either prior to or subsequent to this, bumps 77 are placed at predetermined positions on the circuit substrate 74. Air inside the chamber 72 is then expelled and replaced with Ar gas, thereby providing a predetermined Ar atmosphere.

Subsequently, plasma is generated by the placement base of the bonding stage 10 by supplying electricity to the electrode 14. Plasma processing is then performed by exposing the pad metal of the circuit substrate 74, the bumps 77, and the pad metal of the semiconductor chip 76 to the Ar plasma atmosphere for a predetermined time (e.g., one minute).

Next, the pressure application device 80 is lowered so as to press the bonding tool 71 downwards at a predetermined pressure. The circuit substrate 74 and the semiconductor chip 76 that have been positioned with the bumps 77 sandwiched between the bonding stage 50 and the bonding tool 71 are then compression bonded together. At this time, by operating the ultrasonic oscillation device 75 that is provided with the bonding tool 71 ultrasonic waves are made to act on the bumps 77.

Either prior to the compression bonding process brought about by the lowering of the pressure application device 80, or substantially simultaneously thereto, or else immediately after the compression bonding, electricity is supplied to the electrode 15 of the bonding stage 50 and, at the same time, electricity is supplied to the heater electrode 82 of the bonding tool 71. Accordingly, heat is applied for a predetermined time and at a predetermined temperature, that is, at a temperature less than the melting point of the bumps 77.

By cooling the bumps 77 and the like subsequent to this thermal compression bonding, the semiconductor chip 76 is bonded to the circuit substrate 74 via the bumps 77.

In this type of flip chip bonding method that uses the semiconductor chip packaging apparatus 70, that is, that uses the bonding stage 50, by exposing the bumps 77 to plasma and by also exposing the circuit substrate 74 and the semiconductor chip 76 to plasma, the pad metals and the like of these components are also cleaned. Therefore, it is possible to perform bonding (i.e., packaging) at a low temperature that is lower than the melting point of the bumps, meaning that the bumps do not have to be heated to a high temperature above the melting point thereof. Accordingly, the packaging throughput of electrical components such as the semiconductor chip 76 is improved, and the bonding efficiency can also be improved. As a result, it is possible to achieve packaging that provides a high yield and a high level of reliability.

EXAMPLES

A semiconductor chip packaging test (i.e., a flip chip connection test) was performed using the flip chip bonding method of the present invention, and using the semiconductor chip packaging apparatus 70 shown in FIG. 3. The bumps that were used were composed of Pb/Sn in ratios of 90% by weight to 10% by weight, respectively. The semiconductor test chips used had bump pitches of 200 μm, 150 μm, and 100 μm, and the total number of bumps was 200.

Prior to the flip chip connection, a circuit substrate on which substrate pad metal and bumps were formed and a semiconductor chip on which chip pad metal was formed were exposed to an Ar plasma atmosphere for one minute. Electricity was then supplied to the heater electrode inside the bonding stage and the heater electrode inside the bonding tool so that the respective temperatures thereof were held at 200° C.

As a result of performing a flip chip connection in this manner, 100% excellent connections were obtained for each one of the bump pitches.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description and is only limited by the scope of the appended claims.

What is claimed is:

1. A bonding stage that packages an electronic component on a substrate, comprising:
   a placement member, the placement member having a plasma generating electrode and an electrostatic adhesion electrode, and the placement member having a placement surface on which is placed the substrate or the electronic component; and
   a supporting member that supports the placement member, wherein an aperture portion of the supporting member is joined in an airtight seal to the placement member, and a ceramic thermal insulation material is provided in an inner space of the supporting member such that the inner space is substantially filled with the ceramic thermal insulation material.

2. A bonding stage according to claim 1, wherein the placement member is provided with a heater electrode, and wherein the supporting member is cylindrical.

3. A bonding stage according to claim 1, wherein the ceramic thermal insulation material is an $Al_2O_3$—$SiO_2$—$CaO$—$Li_2O$ based ceramic thermal insulation material.

4. A bonding stage according to claim 1, wherein the supporting member is formed from stainless steel or an Fe—Ni—Co based alloy.

5. A bonding stage according to claim 1, wherein the placement member is joined to the supporting member via an O-ring or a metal gasket.

6. An electronic component packaging apparatus comprising:
   the bonding stage according to claim 1;
   a bonding tool positioned above the bonding stage; and
   a chamber that houses the bonding stage and the bonding tool.

7. A electronic component packaging apparatus according to claim 6, wherein the bonding tool is provided with an electrostatic adhesion mechanism that electrostatically holds the substrate or the electronic component.

8. A electronic component packaging apparatus according to claim 6, wherein the bonding tool is provided with at least one of a plasma generating electrode and a heater electrode.

9. A electronic component packaging apparatus according to claim 6, further comprising a pressure application mechanism that applies pressure to the bonding tool.

10. An electronic component packaging apparatus according to claim 6, wherein the bonding tool is provided with an ultrasonic device that emits ultrasonic waves.

* * * * *